United States Patent [19]
Daoud

[11] Patent Number: 6,122,368
[45] Date of Patent: Sep. 19, 2000

[54] CONNECTOR MOUNTING ARRANGEMENT IN A CENTER LOCATION OF A PLASTIC BOX

[75] Inventor: Bassel Hage Daoud, Parsippany, N.J.

[73] Assignee: Lucent Technologies, Inc., N.J.

[21] Appl. No.: 09/039,817

[22] Filed: Mar. 16, 1998

[51] Int. Cl.[7] .................................................. H04M 1/00
[52] U.S. Cl. ............................................................ 379/399
[58] Field of Search .................................... 379/399, 326, 379/327, 328, 325; 361/356, 426, 56, 119

[56] References Cited

U.S. PATENT DOCUMENTS

| | | | |
|---|---|---|---|
| D. 287,963 | 1/1987 | Fasano et al. ............................ | D13/24 |
| 4,321,650 | 3/1982 | De Luca et al. ......................... | 361/119 |
| 4,575,169 | 3/1986 | Daplatre et al. ......................... | 339/44 |
| 4,645,284 | 2/1987 | Duplatre et al. ......................... | 339/94 |
| 4,651,340 | 3/1987 | Marson ..................................... | 379/156 |
| 4,658,422 | 4/1987 | Sparks ...................................... | 379/442 |
| 4,740,168 | 4/1988 | Carney et al. ............................ | 439/133 |
| 4,752,232 | 6/1988 | De Luca ................................... | 439/133 |
| 4,945,560 | 7/1990 | Collins et al. ............................ | 379/399 |
| 5,044,981 | 9/1991 | Suffi et al. ................................ | 439/533 |
| 5,312,266 | 5/1994 | Daoud ....................................... | 439/304 |
| 5,370,547 | 12/1994 | Daoud ...................................... | 439/304 |
| 5,410,443 | 4/1995 | Pelegris ..................................... | 361/119 |

*Primary Examiner*—Jack Chiang
*Attorney, Agent, or Firm*—Sofer & Haroun, LLP

[57] ABSTRACT

A building entrance protector terminal comprises a housing unit having a plurality of sidewalls and a bottom wall. The sidewall includes an opening that extends from a portion within the sidewall to its rim. A sliding panel is disposed within the opening. A knockout portion is disposed within the sidewall and adjacent the opening, such that when the sliding panel is removed the knockout portion is accessible from the edge of the sidewall.

14 Claims, 3 Drawing Sheets

CONNECTOR MOUNTING ARRANGEMENT IN A CENTER LOCATION OF A PLASTIC BOX

FIELD OF THE INVENTION

The present invention relates to a terminal enclosure and more specifically to a telephone building entrance protector housing or terminal which accommodates convenient wiring modifications.

BACKGROUND OF THE INVENTION

Building entrance protectors are used to provide telephone lines from the telephone company's street cables to multiple tenants of residential or commercial buildings. Typically telephone wire line pairs extend into a splicing connector disposed within the housing of the building entrance protector. Telephone wire lines are then provided to a protection panel that functions to suppress transient electrical signals resulting from thunderstorms and other environmental noises. Telephone wires are then extended to various tenant locations within the building via a cross-connect block. The building entrance protectors may be installed either inside or outside of the building.

In many instances it may become necessary to extend several telephone lines from the building entrance protector housing to a single tenant unit in the building. One way to accomplish such a connection is to run individual lines from the protector housing to the desired tenant unit. However, this approach is very costly. It takes a long time to run individual wires to a location inside the building. Furthermore, maintaining such lines could also be time consuming and expensive.

Another approach to extend several telephone lines from the building entrance protector housing to a single unit in the building is to employ an interconnection system known as the RJ 21 connector. Typically, several telephone line pairs are bundled within a cable, which terminates at one end with a male or female RJ 21 interconnect plug. The other end of the cable is open so that the individual wires could be connected to connection pins disposed within the cross-connect block of the entrance protector terminal. Another cable that includes an appropriate RJ 21 interconnect plug engages with the building entrance protector terminal RJ 21 interconnect plug and extends to the desired unit within the building.

However, in order to protect the individual lines from possible tampering, it is necessary to install a separate RJ 21 housing module, adjacent to the building entrance protector housing. The separate module is connected to the building entrance protector terminal. The module comprises a housing unit that has a knockout section on the side that is disposed next to the building entrance protector terminal. The building entrance protector terminal also includes a knockout section on the side that is disposed next to the RJ 21 housing module. Telephone wires are then extended from the inside of the building entrance protector terminal to the RJ 21 housing module via their corresponding knockout sections. The addition of the RJ 21 housing module leads to additional cost and requires additional space, which may not be feasible.

An additional problem with the RJ 21 housing arrangement mentioned above is the difficulty to remove the knockout sections when they are located in the middle of a flat sidewall surface. Removing the knockout sections requires the use of a cutting tool, such as a utility knife, which is very dangerous to handle and could easily cause injuries.

Thus there is a need for an expedient and inexpensive arrangement to provide easy access to a terminal housing so that for example, RJ 21 interconnect plugs may be mounted without the disadvantages mentioned above.

SUMMARY OF THE INVENTION

In accordance with one embodiment of the invention, a building entrance terminal or the like comprises a housing unit having a plurality of sidewalls and a bottom wall. One of the sidewalls defines an opening extending from a portion within the sidewall to the edge of the sidewall. A sliding panel is disposed within the opening in the sidewalls. A knockout portion is disposed within the sidewall and below the opening, such that when the sliding panel is removed, the knock out portion is accessible from above the sidewall.

In accordance with another embodiment of the invention the portion of the sidewall extending downwardly from the edge of the sidewall along the opening further comprises a dual wall extension that forms a sleeve for frictionally engaging the sliding panel.

BRIEF DESCRIPTION OF THE DRAWINGS

The subject matter regarded as the invention is particularly pointed out and distinctly claimed in the concluding portion of the specification. The invention, however, both as to organization and method of operation, together with features, objects, and advantages thereof may best be understood by reference to the following detailed description when read with the accompanying drawings in which:

DETAILED DESCRIPTION OF THE DRAWINGS

Figure 1:
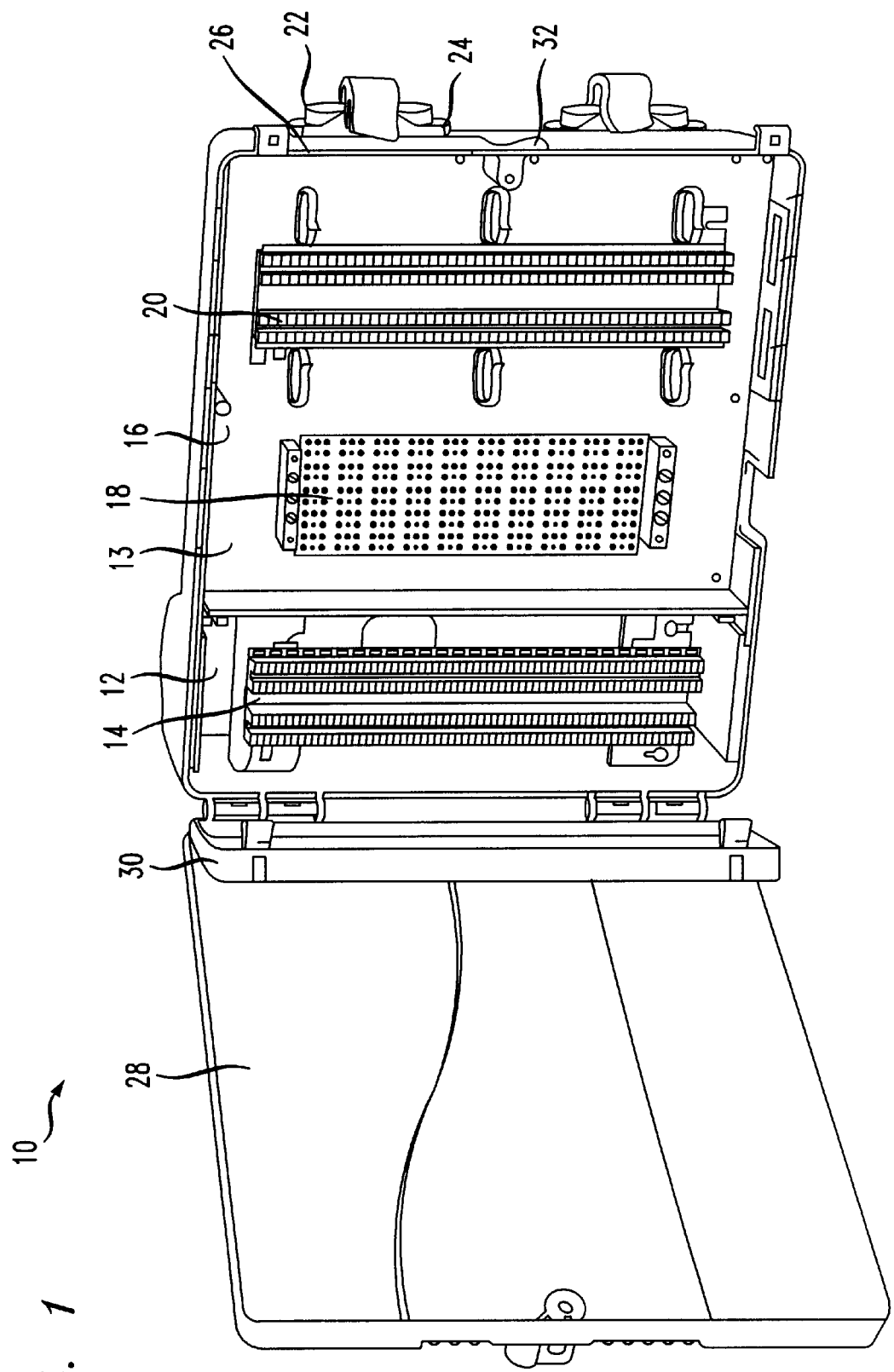
FIG. 1 illustrates a building entrance protector terminal in accordance with one embodiment of the invention.

FIG. 1 illustrates a building entrance protector terminal 10 in accordance with one embodiment of the invention, although the invention is not limited in scope in that respect. For example, other types of enclosures may include the inventive features disclosed herein. Building entrance protector terminal 10 includes a splicing connector 14 disposed within the splice chamber 12. Telephone cables including a plurality of line pairs extend to splicing connector 14. Door 30 is provided to cover splicing connector 14. Furthermore door 28 is provided to cover the entire housing 10.

Building entrance protector 10 also includes a second chamber 13 that is configured to hold a protection panel 18 and a cross-connect block 20. A cover plate 16 is disposed within chamber 13 and serves as a cover plate for hiding and protecting all the wiring connections between protector unit 18 and connection unit 20.

As mentioned before, splicing connector 14 receives telephone wire lines from the telephone company cables. Telephone wire lines are then provided to protection panel 18. Telephone wires are then connected to cross-connect block 20. Cross-connect block 20 includes identification pins corresponding to various units within the building. The identification pins allow the telephone company technician to extend wires to proper units within the building.

As mentioned above, in some circumstances several telephone lines are extended to the same unit in the building. In that event, it is desirable to employ RJ 21 connections to run these telephone lines to the specified unit. In accordance with one embodiment of the invention, as illustrated in FIG. 2, side wall 32 includes various openings 24 which are configured to slidably engage a sliding panel 26.

Each opening 24 is defined by a portion of sidewall 32 that extends downwardly form the upper edge of the sidewall. In accordance with one embodiment of the invention opening 24 is in a shape of a rectangle, although the invention is not limited in scope in that respect. The external and internal surface of sidewall 32 extend beyond the core of the sidewall near the side edges 48 and 50 of opening 24 to form longitudinal sleeves 40 and 52, respectively, that extend downwardly from the top edge of sidewall 32. Sleeves 40 and 52 allow slide panel 26 to securely and slidably engage with sidewall 32. In accordance with one embodiment of the invention sleeves 40 and 52 extend to the same height, or lower than the height of coverplate 16 as measured from the top edge of sidewall 32.

Knockout portions 54 are disposed within sidewall 32 and below openings 24. In accordance with one embodiment of the invention, the perimeter of each knock out portion 54 is configured to have predetermined dimensions that are appropriate for mounting an RJ 21 interconnect plug, although the invention is not limited in scope in that respect, and knockout portions 54 may have other predetermined shapes as desired.

Figure 2:
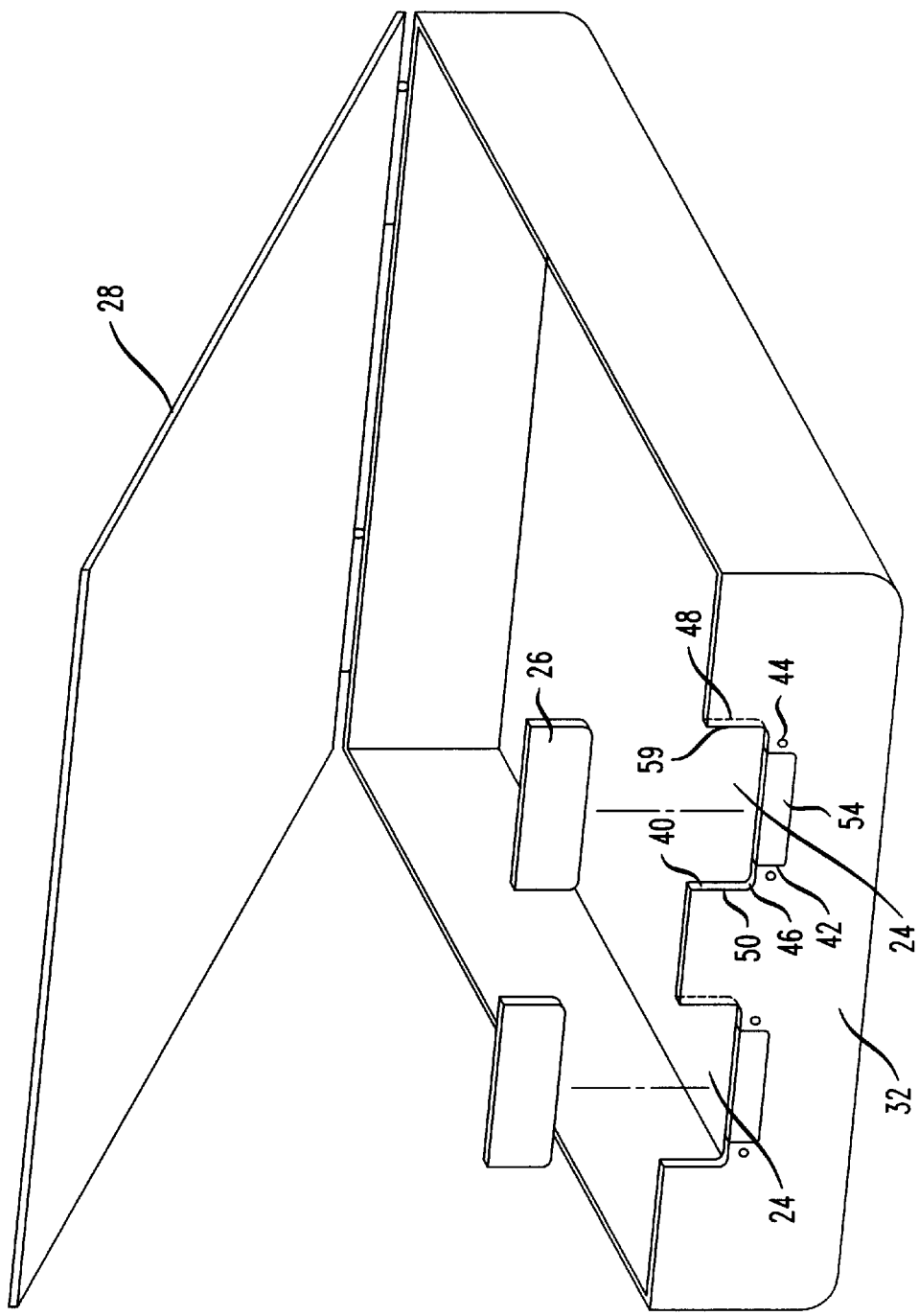
FIG. 2 illustrates a sidewall of the building entrance protector terminal illustrated in FIG. 1.
Figure 3:
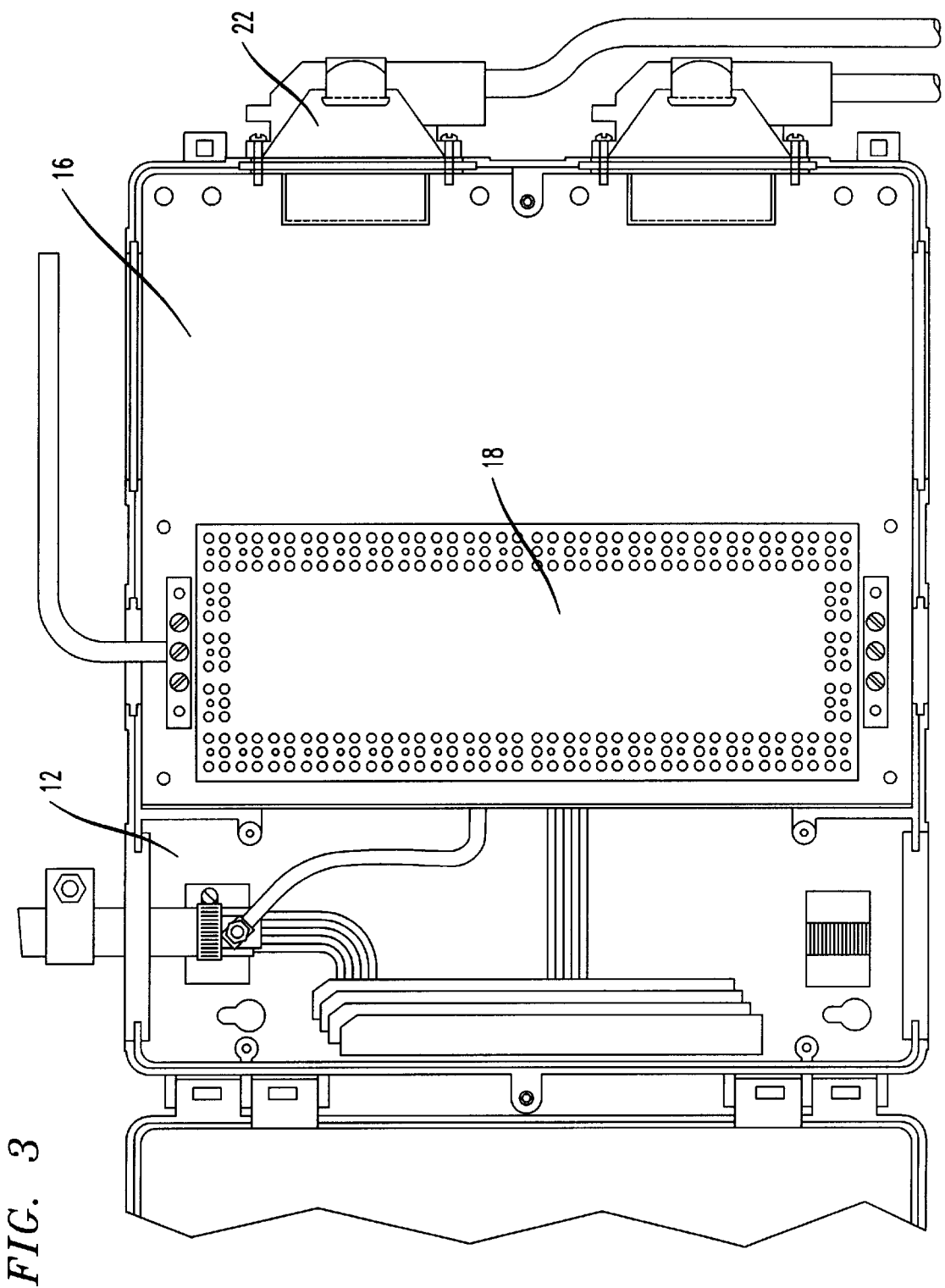
FIG. 3 illustrates a top view of the building entrance protector terminal illustrated in FIG. 1 with a mounted RJ 11 interconnection plug.

FIG. 2 illustrates each knockout portion 54 is in the shape of a rectangle with dimensions that correspond to the size of an RJ 21 interconnect plug 22 as illustrated in FIGS. 1 and 3. The peripheral edges of each knock out portion 54 have a beveled edge so that the thickness of the sidewall around the knock out portion is smaller than the rest of the sidewall, allowing a relatively easy removal by a cutting device such as a plier.

Therefore, whenever there is a desire to have a building entrance protector with a RJ 21 connection, sliding panel 26 is removed from sidewall 32. It is noted that although the present discussion refers to RJ 21 connections, the invention is not limited in scope in that respect and other types of connectors may also be employed. Peripheral edges of knockout portion 54 may then be cut by a cutting device such as a plier from a position above the knockout portion. Thereafter, a RJ 21 interconnect plug is mounted in the opening that is left after the knockout portion is removed. The interconnect plug is then fastened to sidewall 32 by, for example, screws driving into holes 44. Thereafter, cover plate 16 is removed, providing access for connecting telephone line wires to RJ 21 interconnect plug 22. Once all the connections are made and the lines tested, cover plate 16 is fastened back, and sliding panel 26 is guided back to its position within sleeves 50 and 52. It is noted that in accordance with one embodiment of the invention, instead of removing each knockout portions, it is possible to fold the knockout portion by only cutting the side edges and bending the bottom edge backward toward the internal portion of housing 10. Furthermore, the present discussion explains the situation when the knockout portion is below the sliding panel. However, the invention is not limited in scope in that respect. For example, the knockout portion may be adjacently disposed at the side of the sliding panel.

Thus, the present invention allows for mounting interconnect plugs without the need for providing additional modules or exposing users to dangerous cutting knives.

While only certain features of the invention have been illustrated and described herein, many modifications, substitutions, changes or equivalents will now occur to those skilled in the art. It is therefore, to be understood that the appended claims are intended to cover all such modifications and changes that fall within the true spirit of the invention.

I claim:

1. A building entrance protector terminal comprising:

a housing unit having a plurality of sidewalls and a bottom wall, at least one of said sidewalls defining an opening extending from a portion within said sidewall to the edge of said sidewall;

a sliding panel disposed within said opening in said at least one of said sidewalls;

a knockout portion disposed within said sidewall and adjacent to said opening, such that when said sliding panel is removed, said knock out portion is accessible from said opening.

2. A building entrance protector terminal in accordance with claim 1, wherein the portion of said sidewall extending downwardly from the edge of the sidewall along said opening further comprises a sleeve formed by a dual wall extension for frictionally engaging said sliding panel.

3. A building entrance protector terminal in accordance with claim 1, wherein said knockout portion is defined by a beveled edge which has a smaller thickness than the thickness of said sidewall.

4. A building entrance protector terminal in accordance with claim 3 wherein said opening is in a shape of a rectangle.

5. A building entrance protector terminal in accordance with claim 4, wherein said knockout portion is in a shape of a rectangle.

6. A building entrance protector terminal in accordance with claim 5, wherein said knockout portion is removable by a cutting device.

7. A building entrance protector terminal in accordance with claim 6 wherein said knockout portion defines an opening for receiving an RJ 11 connector.

8. A building entrance protector terminal comprising:

a housing unit having a plurality of sidewalls and a bottom wall, at least one of said sidewalls defining an opening extending from a portion within said sidewall to the edge of said sidewall;

a cover plate disposed within said housing unit in parallel with said bottom wall of said housing unit, said coverplate located at least at the same level as the bottom edge of said opening;

a sliding panel disposed within said opening in said at least on of said sidewalls;

a knockout portion disposed within said sidewall and below said opening, such that when said sliding panel is removed, said knock out portion is accessible from above said sidewall.

9. A building entrance protector terminal in accordance with claim 8, wherein the portion of said sidewall extending downwardly from the edge of the sidewall along said opening further comprises a sleeve formed by a dual wall extension for frictionally engaging said sliding panel.

10. A building entrance protector terminal in accordance with claim 8, wherein said knockout portion is defined by a beveled edge which has a smaller thickness than the thickness of said sidewall.

11. A building entrance protector terminal in accordance with claim 10 wherein said opening is in a shape of a rectangle.

12. A building entrance protector terminal in accordance with claim 11, wherein said knockout portion is in a shape of a rectangle.

13. A building entrance protector terminal in accordance with claim 12, wherein said knockout portion is removable by a cutting device.

14. A building entrance protector terminal in accordance with claim 13 wherein said knockout portion defines an opening for receiving an RJ 11 connector.

* * * * *